US009633647B2

United States Patent
Ku

(10) Patent No.: US 9,633,647 B2
(45) Date of Patent: *Apr. 25, 2017

(54) SELF-TUNING TRANSFER FUNCTION FOR ADAPTIVE FILTERING

(71) Applicant: Bose Corporation, Framingham, MA (US)

(72) Inventor: Emery M. Ku, Somerville, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/284,738

(22) Filed: Oct. 4, 2016

(65) Prior Publication Data

US 2017/0025114 A1  Jan. 26, 2017

Related U.S. Application Data

(63) Continuation of application No. 14/963,589, filed on Dec. 9, 2015, now Pat. No. 9,485,035, which is a (Continued)

(51) Int. Cl.
*H04B 1/00* (2006.01)
*H04B 15/00* (2006.01)
(Continued)

(52) U.S. Cl.
CPC ....... *G10K 11/1788* (2013.01); *H04B 1/0475* (2013.01); *H04B 1/62* (2013.01); *H04B 15/00* (2013.01); *G10K 2210/1282* (2013.01); *G10K 2210/3028* (2013.01); *G10K 2210/3032* (2013.01); *G10K 2210/30232* (2013.01)

(58) Field of Classification Search
None
See application file for complete search history.

(56) References Cited

U.S. PATENT DOCUMENTS 5,377,276 A * 12/1994 Terai .................. G10K 11/1784
381/71.11
7,343,016 B2 * 3/2008 Kim .................... G10K 11/178
381/71.1
(Continued)

OTHER PUBLICATIONS

U.S. Appl. No. 14/963,589, Ku.*

*Primary Examiner* — Tuan A Tran
(74) *Attorney, Agent, or Firm* — Fish & Richardson P.C.

(57) ABSTRACT

The technology described in this document can be embodied in a computer-implemented method that includes receiving, at one or more processing devices, a plurality of values representing a set of coefficients of an adaptive filter over a period of time, and identifying, by the one or more processing devices based on the plurality of values, a phase error associated with a transfer function of the adaptive filter. The method also includes adjusting, based on the identified phase error, a phase associated with the transfer function of the adaptive filter such that coefficients calculated using the adjusted transfer function reduce the phase error. The method further includes determining a set of coefficients for the adaptive filter based on the adjusted transfer function, and programming the adaptive filter with the determined set of coefficients to enable operation of the adaptive filter.

20 Claims, 11 Drawing Sheets

Related U.S. Application Data continuation of application No. 14/504,975, filed on Oct. 2, 2014, now Pat. No. 9,240,819.

(51) Int. Cl.
*G10K 11/178* (2006.01)
*H04B 1/04* (2006.01)
*H04B 1/62* (2006.01)

(56) References Cited

U.S. PATENT DOCUMENTS

| | | | | |
|---|---|---|---|---|
| 7,716,046 B2* | 5/2010 | Nongpiur | ............... | G10L 19/26 381/94.1 |
| 8,019,090 B1* | 9/2011 | Agrawal | ............... | G10K 11/178 381/71.1 |
| 8,194,873 B2* | 6/2012 | Pan | ................... | H03H 21/0067 381/71.11 |
| 8,204,242 B2* | 6/2012 | Pan | ..................... | G10K 11/178 381/71.11 |
| 8,270,625 B2* | 9/2012 | Sommerfeldt | ..... | G10K 11/1788 381/71.12 |
| 8,306,240 B2* | 11/2012 | Pan | ..................... | G10K 11/178 381/13 |
| 8,335,318 B2* | 12/2012 | Pan | .................... | G10K 11/1782 381/56 |
| 8,355,512 B2* | 1/2013 | Pan | ..................... | G10K 11/178 381/71.11 |
| 8,378,804 B2* | 2/2013 | Inoue | .................... | B60Q 5/008 340/425.5 |
| 8,571,230 B2* | 10/2013 | Pan | ..................... | G10K 11/178 381/13 |
| 8,600,069 B2* | 12/2013 | Lee | ........................... | H04S 7/00 381/122 |
| 8,798,282 B2* | 8/2014 | Pan | .................... | H03H 21/0067 381/71.11 |
| 2004/0037430 A1* | 2/2004 | Kim | ..................... | G10K 11/178 381/71.8 |
| 2005/0207585 A1* | 9/2005 | Christoph | .......... | G10K 11/1788 381/71.11 |
| 2007/0019825 A1* | 1/2007 | Marumoto | ............... | H04R 5/02 381/94.1 |
| 2010/0215185 A1* | 8/2010 | Christoph | ............. | H04M 9/082 381/71.1 |

\* cited by examiner

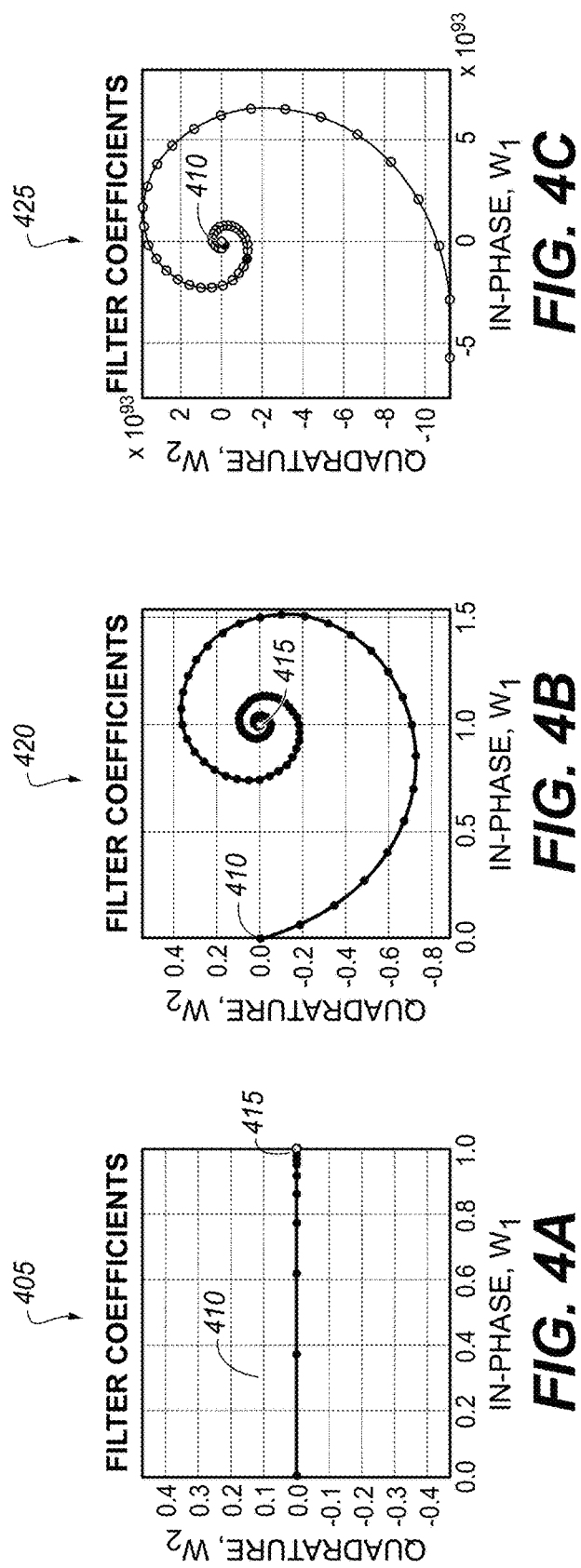

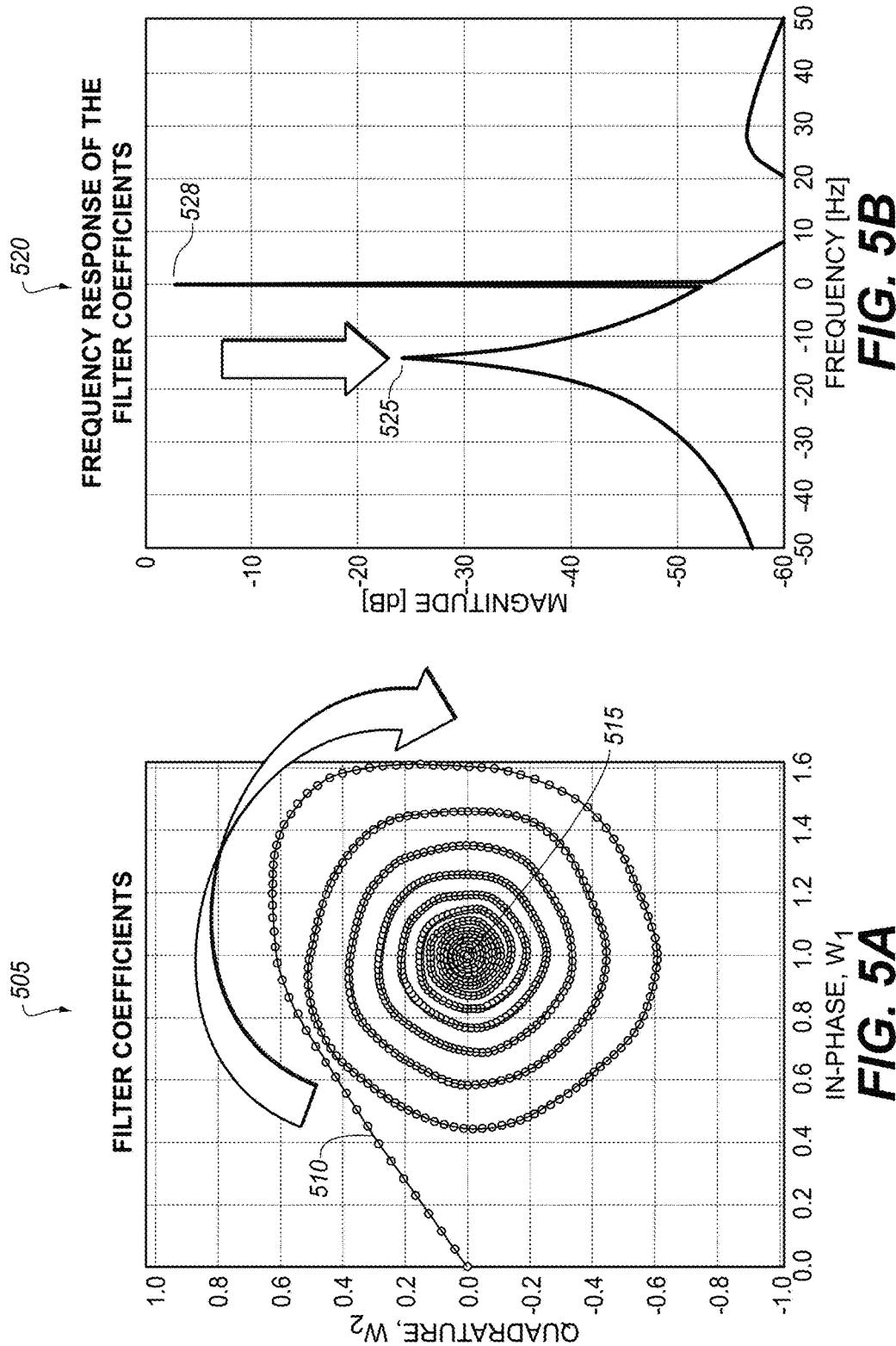

SELF-TUNING TRANSFER FUNCTION FOR ADAPTIVE FILTERING

CROSS REFERENCE TO RELATED APPLICATIONS

This application is a continuation of and claims priority to U.S. application Ser. No. 14/963,589, filed on Dec. 9, 2015, which is a continuation of and claims priority to U.S. application Ser. No. 14/504,975, filed on Oct. 2, 2014, and issued as U.S. Pat. No. 9,240,819. The above applications are incorporated herein by reference in their entirety.

TECHNICAL FIELD

This disclosure generally relates to active noise control.

BACKGROUND

Active noise control involves cancelling unwanted noise by generating a substantially opposite signal often referred to as anti-noise.

SUMMARY

In one aspect, this document features a computer-implemented method that includes receiving, at one or more processing devices, a plurality of values representing a set of coefficients of an adaptive filter over a period of time, and identifying, by the one or more processing devices based on the plurality of values, a phase error associated with a transfer function of the adaptive filter. The method also includes adjusting, based on the identified phase error, a phase associated with the transfer function of the adaptive filter such that coefficients calculated using the adjusted transfer function reduce the phase error. The method further includes determining a set of coefficients for the adaptive filter based on the adjusted transfer function, and programming the adaptive filter with the determined set of coefficients to enable operation of the adaptive filter.

In another aspect, this document features a system that includes an active noise control engine. The active noise control engine includes one or more processors, and is configured to receive a plurality of values representing a set of coefficients of an adaptive filter over a period of time, and identify, based on the plurality of values, a phase error associated with a transfer function of the adaptive filter. The active noise control engine is also configured to adjust, based on the identified phase error, a phase associated with the transfer function of the adaptive filter such that coefficients calculated using the adjusted transfer function reduce the phase error. The active noise control engine is further configured to determine a set of coefficients for the adaptive filter based on the adjusted transfer function, and program the adaptive filter with the determined set of coefficients to enable operation of the adaptive filter.

In another aspect, this document features a computer readable storage device having encoded thereon computer readable instructions, which when executed by a processor, cause a processor to perform operations including receiving a plurality of values representing a set of coefficients of an adaptive filter over a period of time, and identifying, based on the plurality of values, a phase error associated with a transfer function of the adaptive filter. The operations also include adjusting, based on the identified phase error, a phase associated with the transfer function of the adaptive filter such that coefficients calculated using the adjusted transfer function reduce the phase error. The operations further include determining a set of coefficients for the adaptive filter based on the adjusted transfer function, and programming the adaptive filter with the determined set of coefficients to enable operation of the adaptive filter.

Implementations of the above aspects can include one or more of the following. The phase error can be identified based on a trajectory of the coefficients, the trajectory representing variations of the coefficients over the period of time. A sign of the phase error can be identified based on a directional skew of the trajectory. The phase error can be identified based on frequency domain representation of the filter coefficients. The adaptive filter can be disposed in an active noise control system. A control signal can be generated based on an output of the adaptive filter. The control signal can cause production of an anti-noise signal for cancelling a noise signal. The anti-noise signal can be produced by a secondary source. A phase and magnitude of the anti-noise signal can be configured to reduce an effect of the noise signal. An error sensor can be configured to detect a residual noise. The residual noise may result from a partial cancellation of the noise signal by the anti-noise signal. The set of coefficients for the adaptive filter can be determined also based on a first signal that includes the noise signal, and a second signal detected within the active noise control system. The second signal can include an error signal produced via at least a partial cancellation of the noise signal by the anti-noise signal. Adjusting the phase associated with the transfer function can include accessing a model that represents a path between a secondary source that produces the anti-noise signal and a sensor for detecting the error signal, updating at least one parameter associated with the model, and adjusting the phase associated with the transfer function of the adaptive filter based on the updated model. Each of the plurality of values representing the trajectory can be a coefficient of the adaptive filter at a particular time. The phase error associated with the trajectory of the coefficients can be due to a change in (i) an environment in which the active noise control system is disposed, and/or (ii) a transducer producing the anti-noise signal, and/or (iii) a sensor for detecting the error signal. The environment can include an interior of an automobile. The phase associated with the transfer function can be adjusted by changing the phase by a predetermined amount in a direction opposite to the identified phase error. The predetermined amount can be selected such that a stability criterion of the adaptive filter is satisfied. The phase error associated with the trajectory of the coefficients can be identified based on a frequency-domain representation of the coefficients. The phase error associated with the trajectory of the coefficients can be identified based on a representation of the coefficients on a complex plane. An output of the adaptive filter can be used in generating a signal for cancelling harmonic noise produced by a vehicle engine.

Various implementations described herein may provide one or more of the following advantages. By dynamically updating the phase of a transfer function associated with an adaptive filter, the adaptive filter can be made self-tuning with respect to dynamic changes of the environment. In some cases, this may positively affect convergence of the adaptive filter coefficients and noise cancellation. In some cases, these positive effects can be achieved without significantly negatively affecting stability. Active noise control systems can be deployed in environments that can change quickly (e.g., in a vehicle, where rolling down of a window or placing a large item inside the cabin may affect the acoustic environment). By providing a self-tuning transfer function in the adaptive filter, there may be a reduced need for potentially expensive and time-consuming manual tuning.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

FIGS. 4A-4C are plots illustrating trajectories of filter coefficients under various conditions.

FIG. 5A shows an example of a filter coefficient trajectory in the presence of a negative initial phase error in the filter transfer function.

FIG. 5B is a frequency domain representation of the filter coefficients of FIG. 5A.

DETAILED DESCRIPTION

The present application describes techniques for implementing efficient and effective active noise control (ANC) systems.

Acoustic noise control systems are used for cancelling or reducing unwanted or unpleasant noise produced by equipment such as engines, blowers, fans, transformers, and compressors. Acoustic noise control can also be used in automotive or other transportation systems (e.g., in cars, trucks, buses, aircrafts, boats or other vehicles) to cancel or attenuate unwanted noise produced by, for example, mechanical vibrations or engine harmonics.

In some cases, Active Noise Control (ANC) systems can be used for attenuating or canceling unwanted noise. In some cases, an ANC system can include an electroacoustic or electromechanical system that can be configured to cancel at least some of the unwanted noise (often referred to as primary noise) based on the principle of superposition. This can be done by identifying an amplitude and phase of the primary noise and producing another signal (often referred to as an anti-noise) of about equal amplitude and opposite phase. An appropriate anti-noise combines with the primary noise such that both are substantially canceled (e.g., canceled to within a specification or acceptable tolerance). In this regard, in the example implementations described herein, "canceling" noise may include reducing the "canceled" noise to a specified level or to within an acceptable tolerance, and does not require complete cancellation of all noise. ANC systems can be used in attenuating a wide range of noise signals, including low-frequency noise that may not be easily attenuated using passive noise control systems. In some cases, ANC systems provide feasible noise control mechanisms in terms of size, weight, volume, and cost.

Figure 1:
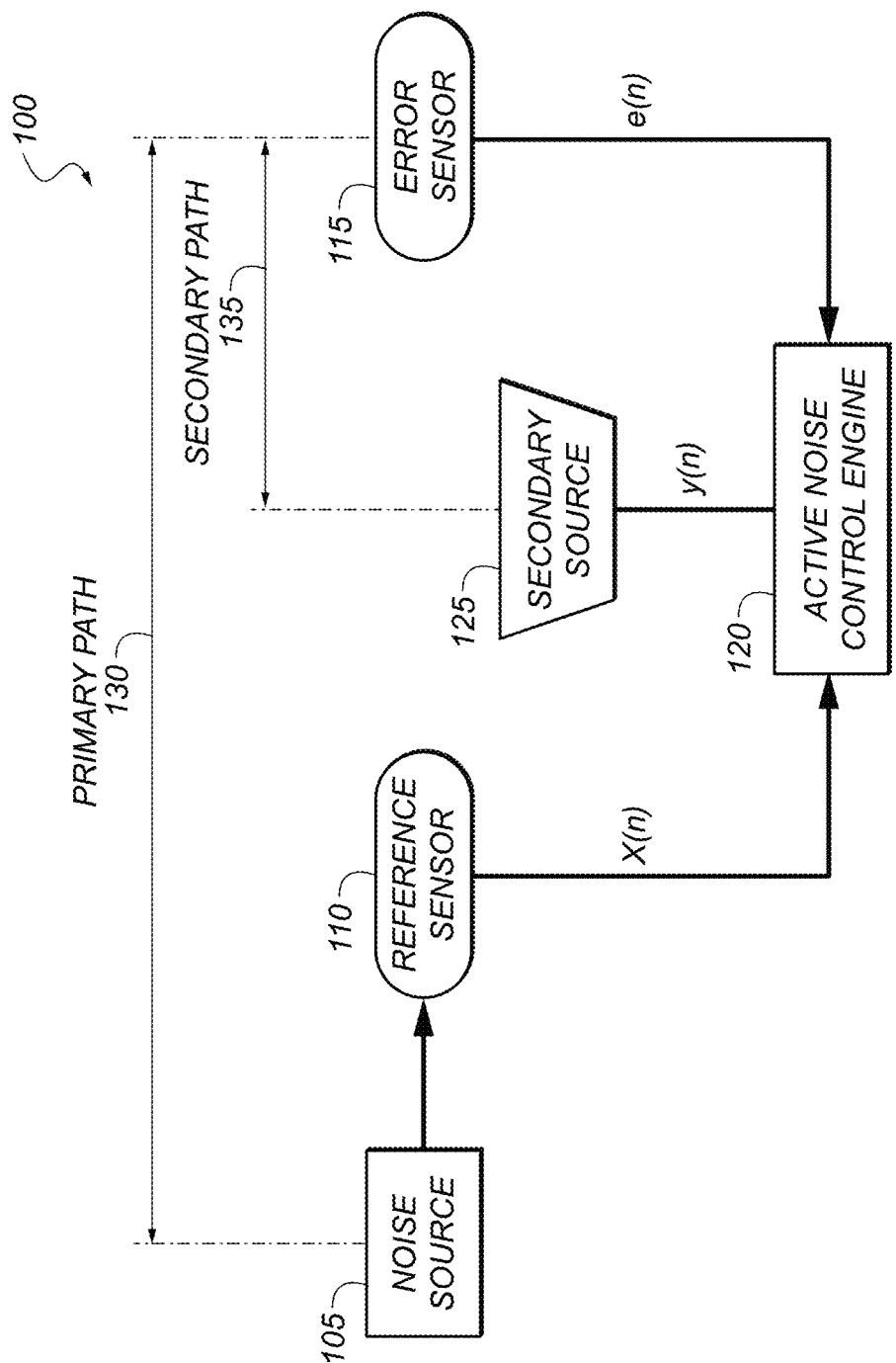
FIG. 1 is a diagram showing an example of an active noise control (ANC) system.

FIG. 1 shows an example of an active noise control system 100 for canceling a noise produced by a noise source 105. This noise can be referred to as the primary noise. The system 100 includes a reference sensor 110 that detects the noise from the noise source 105 and provides a signal to an ANC engine 120 (e.g., as a digital signal x(n)). The ANC engine 120 produces an anti-noise signal (e.g., as a digital signal y(n)) that is provided to a secondary source 125. The secondary source 125 produces a signal that cancels or reduces the effect of the primary noise. For example, when the primary noise is an acoustic signal, the secondary source 125 can be configured to produce an acoustic anti-noise that cancels or reduces the effect of the acoustic primary noise. Any cancellation error can be detected by an error sensor 115. The error sensor 115 provides a signal (e.g., as a digital signal e(n)) to the ANC engine 120 such that the ANC engine can modify the anti-noise producing process accordingly to reduce or eliminate the error.

Components between the noise source 105 and the error sensor 110 are often collectively referred to as the primary path 130, and components between the secondary source 125 and error sensor 115 are often collectively referred to as the secondary path 135. For example, in ANC systems for cancelling acoustic noise, the primary path can include an acoustic distance between the noise source and an error microphone, and the secondary path can include an acoustic distance between an acoustic anti-noise producing speaker and an error microphone. The primary path 130 and/or the secondary path 135 can also include additional components such as components of the ANC system or the environment in which the ANC system is deployed. For example, the secondary path can include one or more components of the ANC engine 120, secondary source 125, and/or the error sensor 115. In some implementations, the secondary path can include electronic components of the ANC engine 120 and/or the secondary source 125, such as one or more digital filters, amplifiers, digital to analog (D/A) converters, analog to digital (A/D) converters, and digital signal processors. In some implementations, the secondary path can also include an electro-acoustic response associated with the secondary source 125, an acoustic path associated with the secondary source 125 and dynamics associated with the error sensor 115. Dynamic changes to one or more of the above components can affect the model of the secondary path, which in turn may affect the performance of the ANC system.

The ANC engine 120 can include an adaptive filter, the coefficients of which can be adaptively changed based on variations in the primary noise. The variations of the filter coefficients may be represented in an N-dimensional space, where N is the number of coefficients associated with the adaptive filter. For example, coefficient variation of a two-tap filter (e.g., a filter with two coefficients) can be represented on a two-dimensional plane. The time-varying path of the filter coefficients in the corresponding space can be referred to as the filter coefficient trajectory associated with the adaptive filter. The time-varying coefficients of the adaptive filter can be generated, for example, based on a transfer function associated with the adaptive filter. The transfer function can be generated based on the characteristics of the secondary path, which, in some cases, do not vary with time. In some situations however, the electro-acoustic characteristics of the secondary path 135 can vary as a function of time. The example implementations described in this document allow for dynamically updating the model of the secondary path 135 based on the filter coefficient trajectory, thereby leading to acceptable levels of noise cancellation.

The noise source 105 can be of various types. For example, the noise source 105 can be a vehicular engine associated with a car, an aircraft, a ship or boat, or a railway locomotive. In some implementations, the noise source 105 can include an appliance such as a heating, ventilation, and air conditioning (HVAC) system, a refrigerator, an exhaust fan, a washing machine, a lawn mower, a vacuum cleaner, a humidifier, or a dehumidifier. The noise source 105 can also include industrial noise sources such as industrial fans, air ducts, chimneys, transformers, power generators, blowers, compressors, pumps, chain saws, wind tunnels, noisy plants or offices. Correspondingly, the primary path 130 includes the acoustic path between the noise source 105 and the location where the reference sensor 110 is disposed. For example, to reduce noise due to a HVAC system, the reference sensor 110 can be disposed within an air duct to detect the corresponding primary noise. The primary noise generated by the noise source 105 can include harmonic noise.

The reference sensor 110 can be selected based on the type of primary noise. For example, when the primary noise is acoustic, the reference sensor 110 can be a microphone. In implementations where the primary noise is produced by sources other than an acoustic source, the reference sensor 110 can be selected accordingly. For example, when the primary noise is harmonic noise from an engine, the reference sensor 110 can be a tachometer. The example ANC technology described in the document may therefore be applied for cancelling or reducing the effect of different types of noises using appropriate reference sensors 110 and secondary sources. For example, to control a structural vibration, the reference sensor 110 can be a motion sensor (e.g., an accelerometer) or a piezoelectric sensor and the secondary source 125 can be a mechanical actuator that can be configured to produce an appropriate vibratory anti-noise.

Figure 2:
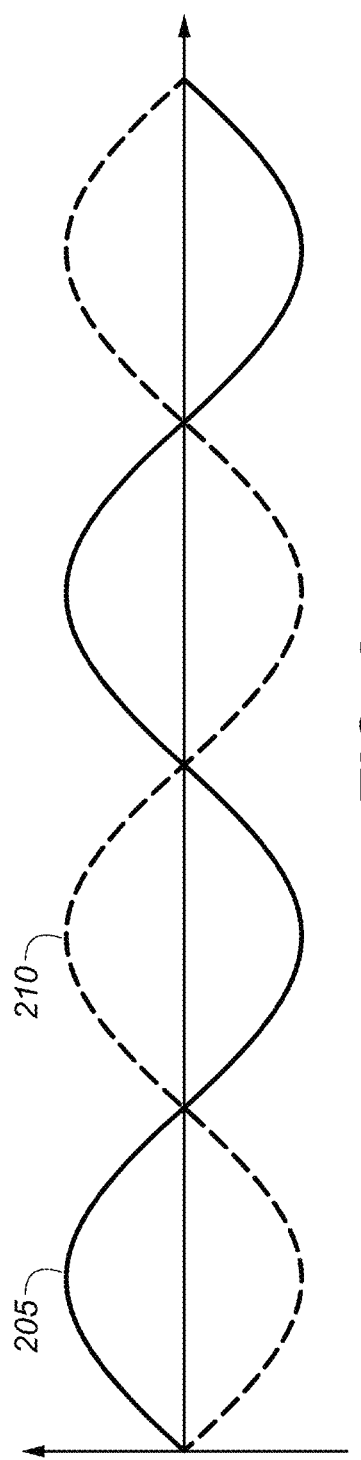
FIG. 2 is a plot illustrating principles of an ANC system.

In some implementations, the secondary source 125 can be positioned such that the acoustic signal produced by the secondary source 125 reduces the effect of the primary noise. For example, if the system 100 is deployed to reduce the effect of engine noise within the cabin of a car, the secondary source 125 is deployed within the cabin. In this example, the secondary source 125 is configured to produce an acoustic signal that cancels or reduces the effect of primary noise within a target environment. This is illustrated with the example shown in FIG. 2. In FIG. 2, the goal is to cancel or reduce the effect of the acoustic signal represented by the wave 205. In such a case, the secondary source 125 can be configured to produce an acoustic signal represented by the wave 210 to cancel or reduce the effect of the signal represented by the wave 205. The amplitude and phase of the signal represented by the wave 210 can be configured such that a superposition of the two signals effectively cancel the effect of one another. Note that acoustic signals are longitudinal waves, and represented using the transverse waves 205 and 210 for illustrative purposes.

In some cases, the characteristics of the primary noise may vary with time. In such cases, the acoustic signal generated by the secondary source 125 may not immediately reduce the primary noise to a desirable level. In some cases, this can give rise to a residual noise that is detected by the error sensor 115. Accordingly, the error sensor 115 provides a signal (e.g., the digital signal e(n)) to the ANC engine 120, which adjusts the output (e.g., y(n)) provided to the secondary source in a way that the residual noise is reduced. The error sensor 115 is therefore deployed in the target environment in some implementations. For example, when the ANC system is deployed for reducing engine noise within the cabin of a car, the error sensor 115 can be deployed within the cabin in a position where it would effectively detect residual noise.

The ANC engine 120 can be configured to process the signals detected by the reference sensor 110 and the error sensor 115 to produce a signal that is provided to the secondary source 125. The ANC engine 120 can be of various types. In some implementations, the ANC engine 120 is based on feed-forward control, in which the primary noise is sensed by the reference sensor 110 before the noise reaches the secondary source such as the secondary source 125. In some implementations, the ANC engine 120 can be based on feedback control, where the ANC engine 120 attempts to cancel the primary noise based on the residual noise detected by the error sensor 115 and without the benefit of a reference sensor 110.

The ANC engine 120 can be configured to control noise in various frequency bands. In some implementations, the ANC engine 120 can be configured to control broadband noise such as white noise. In some implementations, the ANC engine 120 can be configured to control narrow band noise such as harmonic noise from a vehicle engine. The technology described in this document is illustrated primarily using examples of a narrow-band adaptive feed-forward ANC system such as a single-input-single-output (SISO), single frequency ANC system. However, other ANC systems such as multiple-input-multiple-output (MIMO), feedback based, and/or broadband ANC systems are also within the scope of the present disclosure.

In some implementations, the ANC engine 120 includes an adaptive digital filter, the coefficients of which can be adjusted based on, for example, the variations in the primary noise. In some implementations, the ANC engine is a digital system, where signals from the reference and error sensors (e.g., electroacoustic or electromechanical transducers) are sampled and processed using processing devices such as digital signal processors (DSP), microcontrollers or microprocessors. Such processing devices can be used to implement adaptive signal processing processes used by the ANC engine 120.

Figure 3:
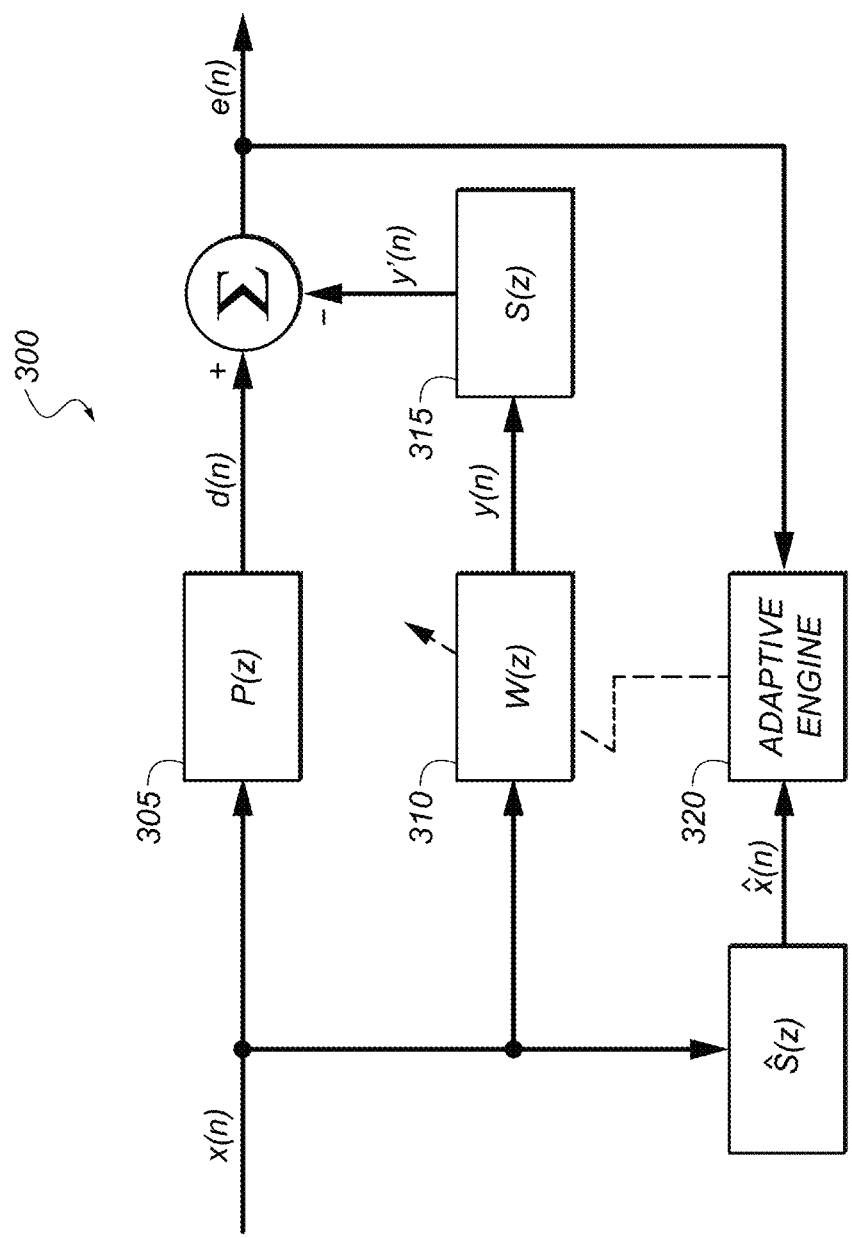
FIG. 3 is a block diagram of an example ANC system.

FIG. 3 is a block diagram showing implementation details of an example ANC system 300. The ANC system 300 includes an adaptive filter that adapts to an unknown environment 305 represented by P(z) in the z domain. In this document, frequency domain functions may be represented in terms of their z domain representations, with the corresponding time domain (or sample domain) representations being functions of n. In the present example, the primary path includes an acoustic path between the reference sensor and the error sensor. Also, in this example, the transfer function of the secondary path 315 is represented as S(z). The adaptive filter 310 (represented as W(z)) can be configured to track time variations of the environment 305. In some implementations, the adaptive filter 310 can be configured to reduce (e.g., to substantially minimize) the residual error signal e(n). Therefore, the adaptive filter 310 is configured such that the target output y(n) of the adaptive filter 310, as processed by the secondary path, is substantially equal to the primary noise d(n). The output, when processed by the secondary path, can be represented as y'(n). The primary noise d(n), in this example is the source signal x(n) as processed by the unknown environment 305. Comparing FIG. 3 with the example of an ANC system 100 deployed in a car, the secondary path 315 can therefore include the secondary source 125 and/or the acoustic path between the secondary source 125 and the error sensor 115. When d(n) and y(n) are combined, the residual error is e(n) is substantially equal to zero for perfect cancellation, and non-zero for imperfect cancellation.

In some implementations, the filter coefficients of the adaptive filter 310 can be updated based on an adaptive process implemented using an adaptive engine 320. The adaptive engine 320 can be implemented using a processing device such as a DSP, microcontroller, or microprocessor, and can be configured to update the coefficients of the adaptive filter 310 based on the error signal e(n) and/or the source signal x(n). In some implementations, a version of the source signal, as processed by the secondary path may also be used. Such a signal can be represented as:

$$\hat{x}(n) = \Sigma_{m=0}^{M-1} \hat{s}_m x((n-m)$$

where, $\hat{s}_m$ is the M-th order estimate of the secondary path impulse response, and $\hat{S}(z)$ is the corresponding z domain representation.

The adaptive filter 310 can include multiple adjustable coefficients. For illustrative purposes, the description below uses examples of a two-tap filter with coefficients $w_0$ and $w_1$. Higher order filters may also be implemented using the techniques described herein. For the two-tap filter, the time varying coefficients $w_0$ and $w_1$ can be represented as:

$$w_0(n+1) = w_0(n) + \mu \hat{x}_0(n) e(n)$$

$$w_1(n+1) = w_1(n) + \mu \hat{x}_1(n) e(n)$$

where $$x_0(n) = A \cos(\omega_0 n)$$

$$x_1 = A \sin(\omega_0 n)$$

represent orthogonal basis functions for x(n), $\omega_0$ is the frequency of x(n), and µ represents a scalar quantity for step size, i.e., a variable controlling how much the coefficients are adjusted towards the destination in each iteration.

The adaptive engine 320 can be configured to update the adaptive filter coefficients in various ways. For example, the adaptive engine 320 can be configured to implement a least mean square (LMS) process to update the filter coefficients. For example, the vector of filter coefficient can be updated as:

$$w(n+1) = w(n) - \frac{\mu}{2} \nabla \xi(n)$$

where $$\xi(n) \equiv E[e^2(n)]$$

is the mean squared error, and $$\hat{\xi}(n) = e^2(n)$$

$$\nabla \hat{\xi}(n) = 2[\nabla e(n)] e(n)$$

Further, because $$e(n) = d(n) - w^T(n) x(n)$$

$$\nabla \hat{\xi}(n) = -2x(n) e(n)$$

and the vector of filter coefficient can be updated as:

$$w(n+1) = w(n) + \mu x(n) e(n)$$

In some implementations, the adaptive engine 320 can be configured to implement a filtered X-LMS (FxLMS) process that uses affine projection. In this process, the adaptive engine 320 can be configured to use past data to determine a future coefficient. In some implementations, using the FxLMS process, the vector of filter coefficients can be determined as:

$$w(n+1) = w(n) + \mu X_{ap}(n) e_{ap}(n)$$

where $X_{ap}$ is a matrix that represents historical data related to the coefficient, with the number of columns being equal to the number of historical samples, and the number of rows being equal to the number of adaptive coefficients. $e_{ap}$ is a vector that represents corresponding historical error data. For example, for a two tap filter and five historical samples, $X_{ap}$ is a matrix with two rows and five columns, and $e_{ap}$ is a vector of five elements. In some implementations, the number of historical samples used by the adaptive engine 320 can be experimentally determined, or determined based on theoretical criteria. In the examples used in this document, the number of historical samples was taken as the number of samples in one full period corresponding to the frequency being cancelled.

The variations of the filter coefficients represented in an N-dimensional space (where N is the number of coefficients) can be referred to as a filter coefficient trajectory. For example, coefficient variation of the two-tap filter of the current example can be represented on a two-dimensional plane (as shown in FIGS. 4A and 4B), with the two coefficients being represented along the two orthogonal axes. FIG. 4A shows an example 405 where there is no phase error in the adaptive filter transfer function. In such a case, the filter coefficient trajectory extends from the initial point 410 to the final point 415 in a substantially linear way as seen in FIG. 4A. In the examples described herein, the adaptive filter coefficients are initialized as [0, 0] and the noise signal being canceled has a complex phasor of [−1, 0]. Consequently, the initial point 410 of the trajectory of the adaptive filter coefficients is the origin and the desired destination or final point 415 is [1, 0].

In practical situations however, phase errors are introduced in the transfer function of the adaptive filter based on variations in the transfer function of the secondary path. The variations in the transfer function of the secondary path can be due to various reasons. In the example where the ANC system is deployed in a car, the transfer function or model of the secondary path can depend on acoustic paths between the secondary source (e.g., speakers producing the anti-noise) and the error sensors such as microphones deployed in the cabin. During the lifetime of the vehicle, these quantities can change for a range of reasons: such as variations in cabin acoustics due to opening/closing of windows, repositioning of seats, or placement of large amount of baggage in the cabin. In some cases, the secondary path can also be affected by changes in mechanical properties (e.g., compliance) of the secondary source and or the error sensing microphones. Such variations in the model or transfer function of the secondary path can in turn introduce phase errors in the transfer function of the adaptive filter.

In the presence of a phase error in the transfer function of the adaptive filter, the filter trajectory between the initial point 410 and the final point 415 is non-linear. This is illustrated in the example 420 shown in FIG. 4B, where the filter coefficients converge to the final point 415 in a trajectory that is represented as a spiral on the two-dimensional plane. In the example of FIG. 4B, the filter coefficients are shown to converge even though the filter transfer function includes a phase error. In some cases though, if the phase error of the filter transfer function exceeds a tolerance level, the coefficients may not converge, thereby causing the system to go unstable. For example, a large magnitude of the error may lead to a large step size that causes the error to increase instead of decreasing, thereby rendering the system unstable. An example 425 is shown in FIG. 4C, where the filter trajectory spirals out from the initial point 410, thereby rendering the filter unstable.

In some implementations, stability of adaptive filters can be improved by identifying a phase error associated with the transfer function, and adjusting the phase of the transfer function based on the identified phase error, such that newer coefficients calculated using the adjusted transfer function reduce the phase error. This can be done, for example, by identifying an amplitude and sign of the phase error and adjusting the phase in an opposite direction. The adjusted phase accounts for the dynamic changes in the secondary path, thereby allowing for effective active noise control.

Figure 5D:
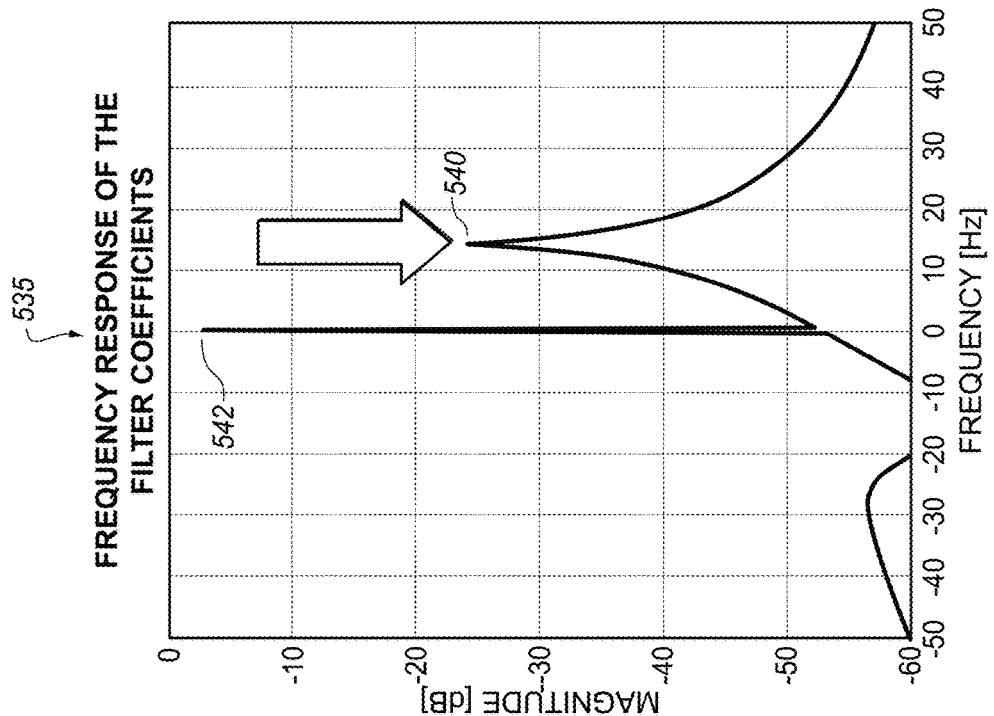
FIG. 5D is a frequency domain representation of the filter coefficients of FIG. 5C.
Figure 5C:
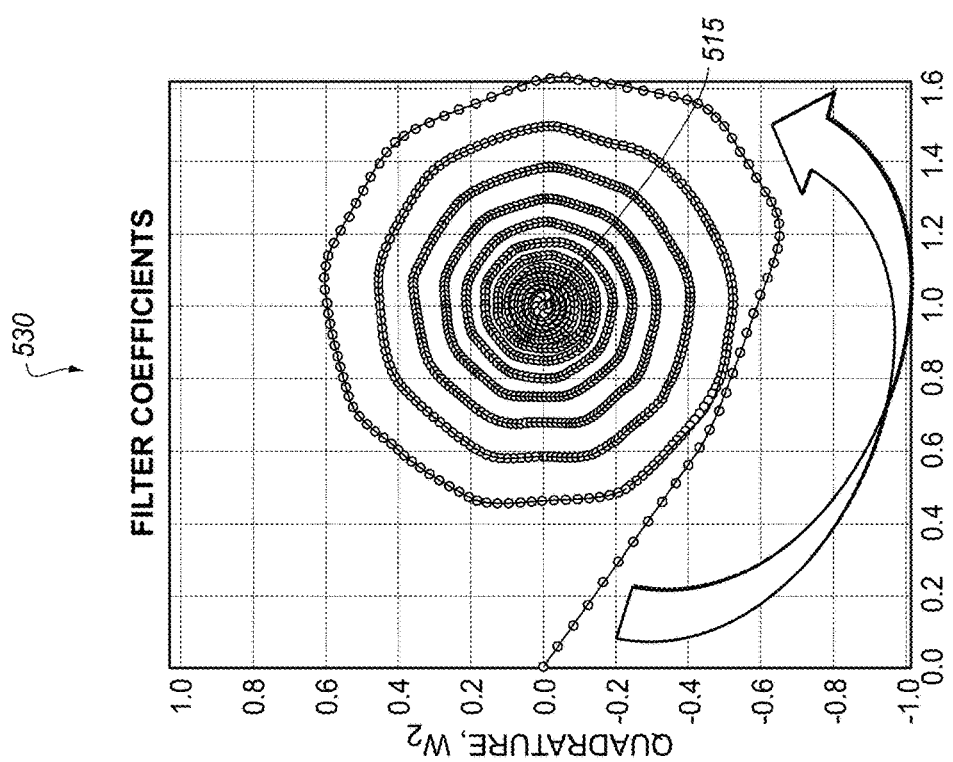
FIG. 5C shows an example of a filter coefficient trajectory in the presence of a positive initial phase error in the filter transfer function.

In some implementations, a nature of the phase error can be identified using the representation of the trajectory of the filter coefficients. For example, the nature of the trajectory can be used to identify whether the phase error is negative or positive. This is illustrated using the example 505 shown in FIG. 5A which shows a filter trajectory 510 for a two-tap filter represented on a two dimensional plane. In this example, the initial positive angle of the trajectory with respect to the x-axis indicates the presence of a negative initial phase error. The initial negative phase error causes the filter trajectory to follow a clockwise spiral before converging at the final point. FIG. 5C shows another example where the initial negative angle of the trajectory with respect to the x-axis indicates the presence of a positive initial phase error. The initial positive phase error causes the filter trajectory to follow an anti-clockwise spiral before converging at the final point.

In some implementations, the nature of the phase error can also be identified based on a frequency domain representation of the filter coefficients. This is illustrated using the examples of FIG. 5B and FIG. 5D, which show the frequency domain representations of the filter coefficients of FIG. 5A and FIG. 5C, respectively. The example 520 depicted in FIG. 5B represents a Fast Fourier Transform (FFT) of $[w_1(n)+jw_2(n)]$, $w_1(n)$ and $w_2(n)$ being the coefficients of the two-tap filter. As seen in the example 520 of FIG. 5B, the initial negative phase error is manifested in the frequency domain as an additional peak or sidelobe 525 to the left of the main peak 528. Further, as seen in the example 535 of FIG. 5D, the initial positive phase error is manifested in the frequency domain as an additional peak or sidelobe 540 to the right of the main peak 542.

Figure 6A:
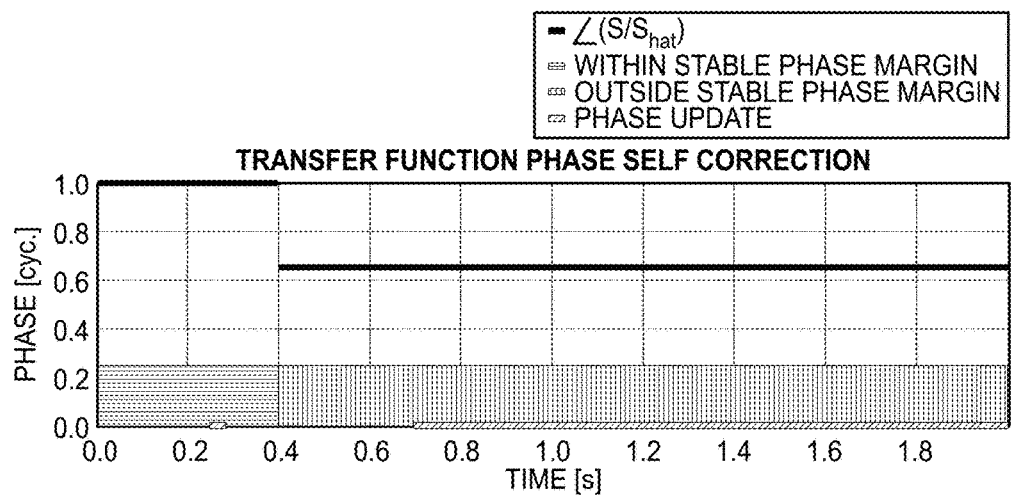
FIGS. 6A-6D illustrate an example in which transfer function phase is not dynamically adjusted.
Figure 6B:
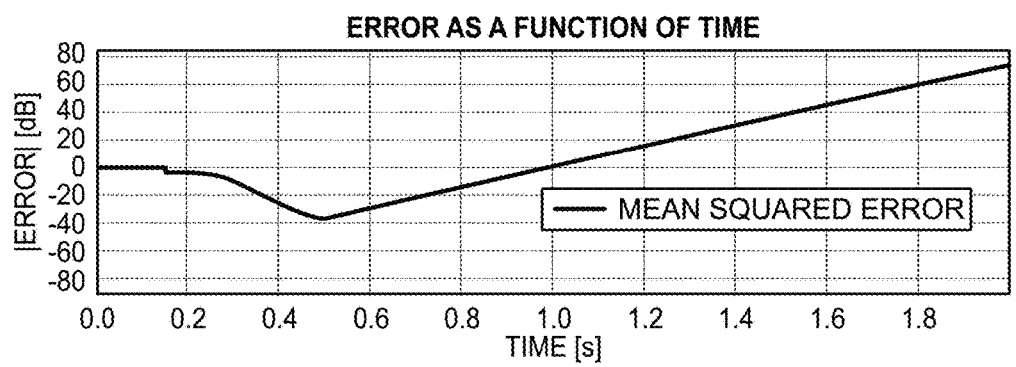
Figure 6C:
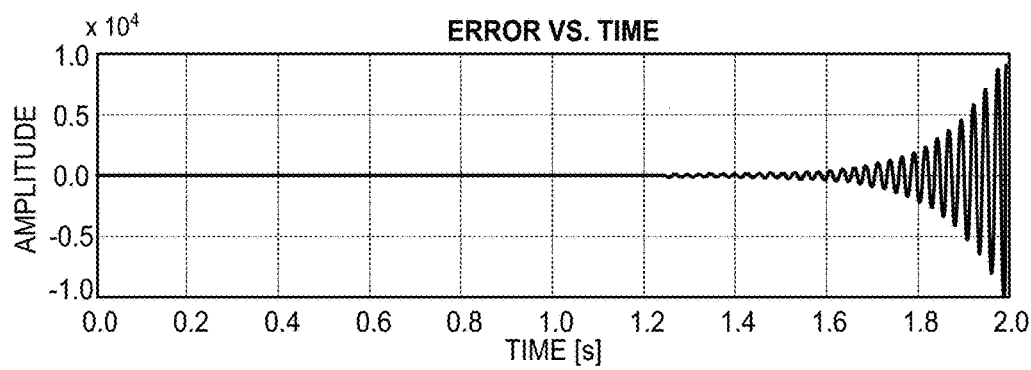
Figure 6D:
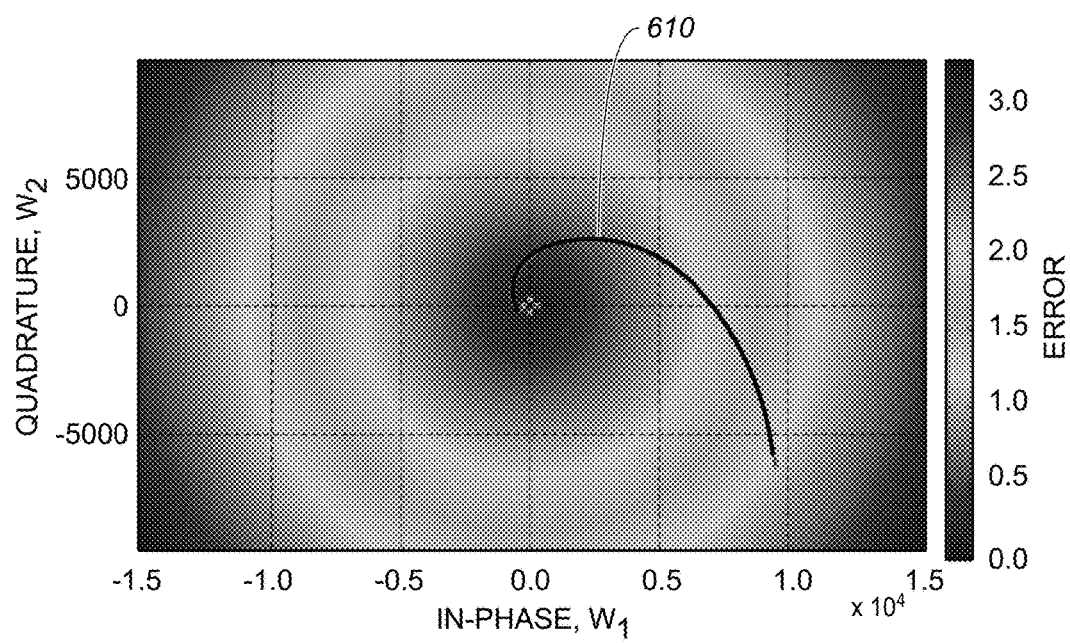

The sign of the phase error associated with the transfer function of the adaptive filter can therefore be identified from the nature of the filter coefficient trajectory or a frequency domain representation of the filter coefficient trajectory. This information can then be used in correcting for the phase error such that the error is reduced. In some implementations, this results in faster convergence, therefore allowing an ANC system to adapt faster to dynamic changes in the environment including the secondary path. This can be done, for example, by adjusting the coefficients fewer numbers of times (i.e., with increased step sizes). Increased step sizes can be beneficial in reducing overall latency in some cases. However, in the absence of knowledge about the transfer function phase error, an increased step size may allow the error to deviate from the tolerance limit, resulting in the system becoming unstable. This is shown in the examples of FIG. 6A-6D. In this simulated example, a phase error of 0.65 cycle was introduced at 0.4 seconds, as shown in FIG. 6A. The introduced error was outside the stable phase margin for the transfer function, and no transfer function phase correction was performed. As shown in FIGS. 6B and 6C, this caused the error to increase, ultimately rendering the system unstable. FIG. 6B shows the variation (in dB) in the mean squared error and FIG. 6C shows the corresponding variations in the amplitude of the error. The corresponding filter coefficient trajectory 610 is shown in FIG. 6D, which shows the trajectory spiraling away from the final point [1, 0] on the two dimensional plane.

Figure 7A:
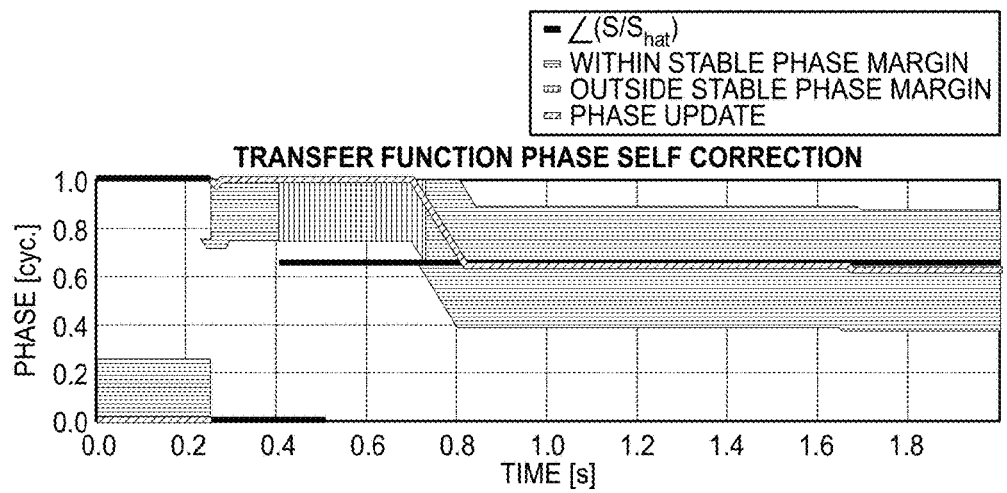
FIGS. 7A-7D illustrate an example in which transfer function phase is dynamically adjusted.
Figure 7B:
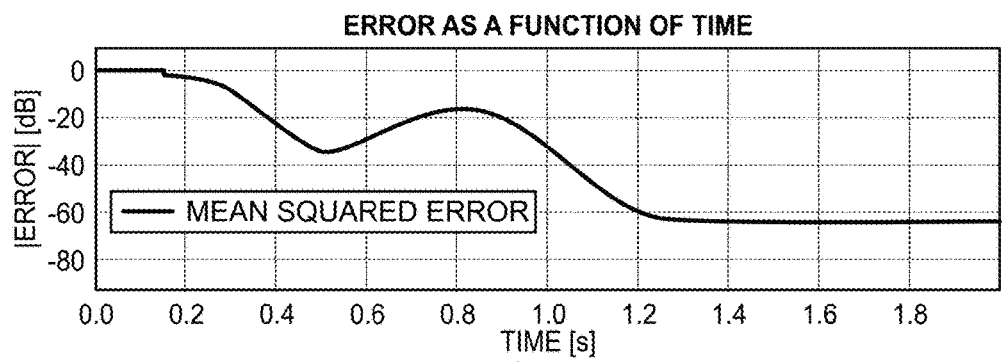
Figure 7C:
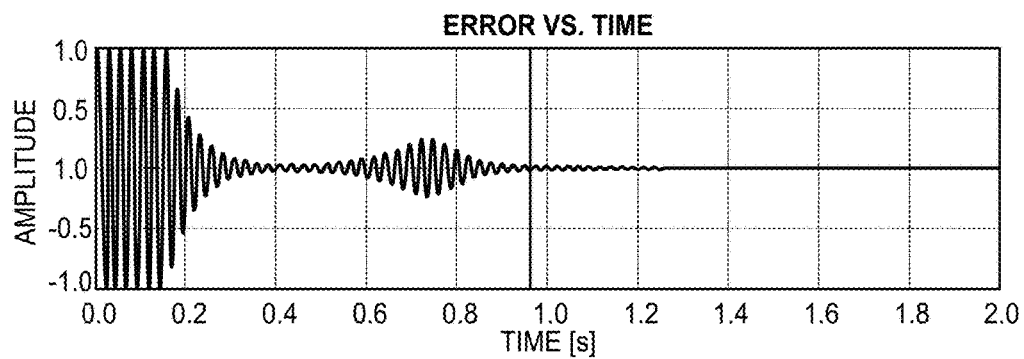
Figure 7D:
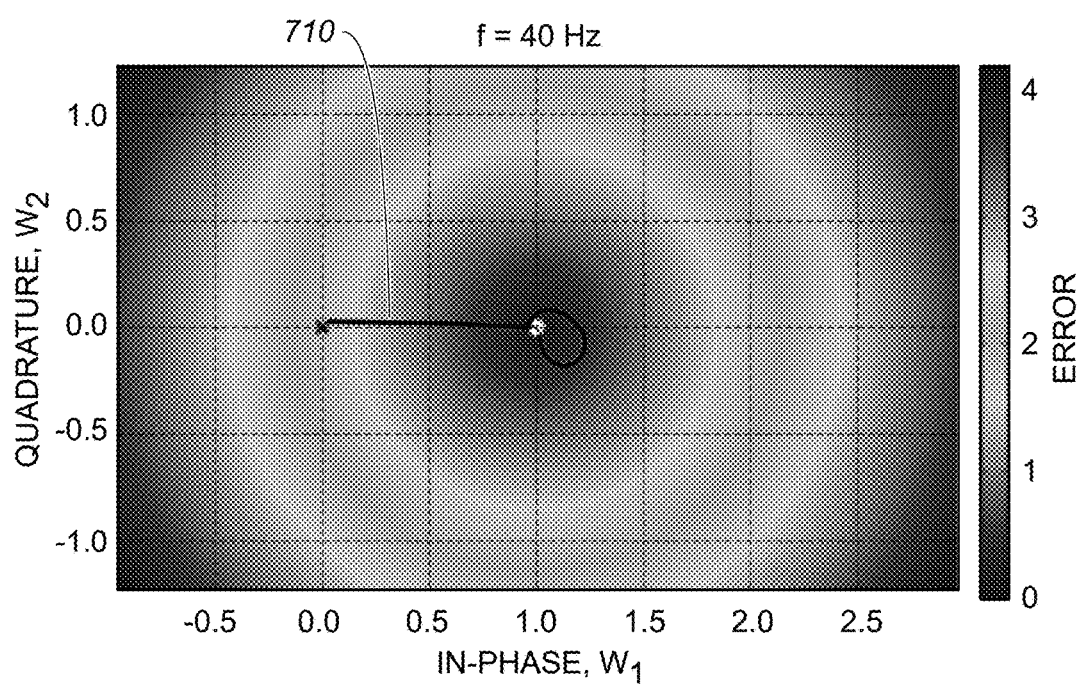

In some implementations, having knowledge about the nature of the phase error allows for determining an increased step size (represented as p) without increasing the risk of the system becoming unstable. Once determined, the step size can be held kept substantially unchanged for the convergence process. This is illustrated in the examples of FIG. 7A-7D. In this simulated example, the same phase error (as in the example of FIG. 6A-6D) of 0.65 cycle was introduced at 0.4 seconds, as shown in FIG. 7A. The introduced error was again outside the stable phase margin for the transfer function, but in this case transfer function phase correction was performed. As shown in FIGS. 7B and 7C, this caused the error to converge to a steady state value after increasing briefly following the introduction of the phase error. The corresponding filter coefficient trajectory 710 is shown in FIG. 7D, which shows the trajectory converging to the final point on the two dimensional plane.

Figure 8:
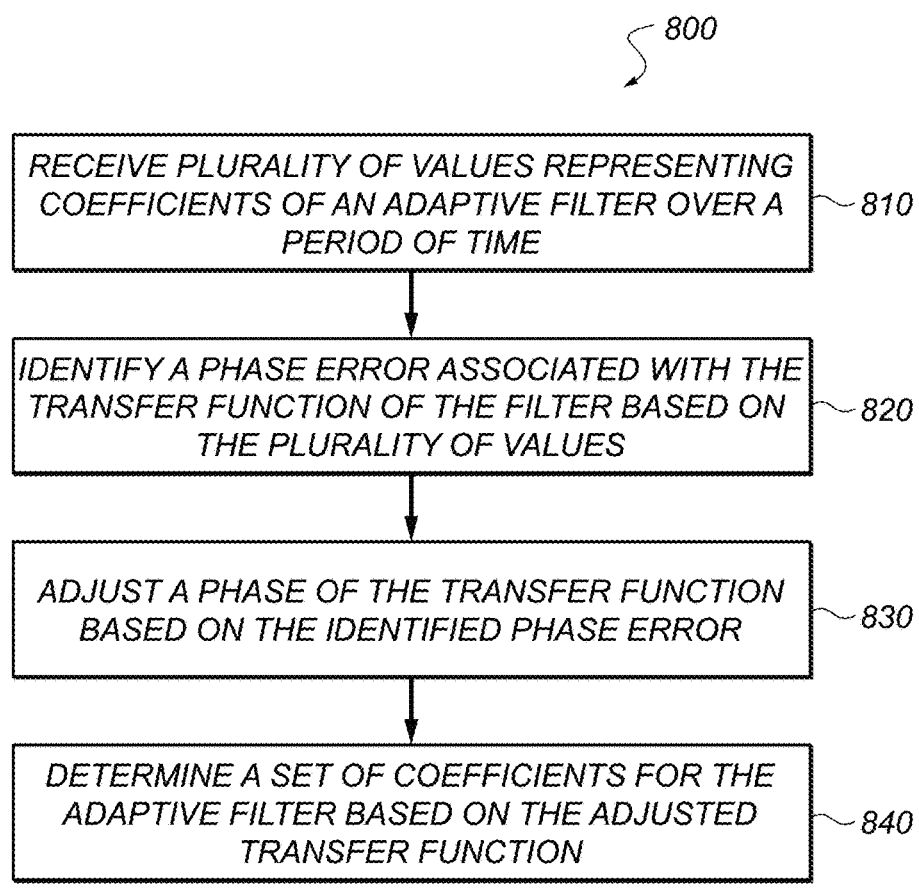
FIG. 8 is a flowchart of an example process for generating adaptive filter coefficients using a dynamically adjusted transfer function.

Therefore, in some examples, a stable and fast-converging ANC may be implemented based on identifying the phase error associated with the transfer function of the adaptive filter. FIG. 8 shows a flowchart for an example process 800 for generating adaptive filter coefficients using an adjusted transfer function. Example operations of the process 800 include receiving a plurality of values that represents coefficients of an adaptive filter over a period of time (810). In some implementations, the adaptive filter may be deployed within an ANC system such as an ANC system for cancelling harmonic noise in a vehicle. In some implementations, the plurality of values can represent a trajectory of the coefficients of the adaptive filter. In some implementations, the plurality values can represent a frequency domain representation of the coefficients. For example, the plurality values can represent FFT values derived based on the plurality of coefficients of the adaptive filter.

The operations also include identifying a phase error associated with a transfer function of the adaptive filter based on the plurality of values (820). In some implementations, the phase error is identified, for example, based on a directional skew of the trajectory of the filter coefficients. For example, in case of a two-tap filter where the trajectory is represented on a two dimensional plane, a positive angle of the initial portion of the trajectory with respect to the x axis may indicate the presence of a negative phase error. Conversely, a negative angle of the initial portion of the trajectory with respect to the x axis may indicate the presence of a positive phase error. In some implementations, the sign of the phase error can also be determined based on identifying if the trajectory is clockwise or anti-clockwise. For example, a clockwise trajectory can indicate the presence of a negative phase error, and an anti-clockwise trajectory can indicate the presence of a positive phase error.

In some implementations, the sign of the phase error can also be determined based on a frequency domain representation of the filter coefficient trajectory. For example, the sign of the phase error may be determined based on the relative location of a secondary peak or sidelobe with respect to a main peak representing the frequency that that the filter is targeting to cancel. As illustrated above in FIGS. 5B and 5D, for a two-tap filter, a negative or positive phase error can be identified based on determining whether the secondary peak or sidelobe is to the left or right, respectively, of the main peak.

The operations can further include adjusting a phase of the transfer function based on the identified phase (830). The phase of the transfer function can be adjusted, for example, to reduce the phase error relative to a reference, such as a prior value of the phase error. For example, the phase of the transfer function can be adjusted such that coefficients calculated using the adjusted transfer function reduce the phase error relative to the reference. In some implementations, adjusting the phase of the transfer function includes accessing a model of the secondary path, and updating at least one parameter associated with the model. The phase is then adjusted based on the updated model. In some implementations, adjusting the phase can include changing the phase by a predetermined amount in a direction opposite to the direction of the identified phase error. The predetermined amount can be selected, for example, such that a stability criterion of the adaptive filter is satisfied.

The operations also include determining a set of coefficients for the adaptive filter based on the adjusted transfer function (840). In some implementations, the adaptive filter output produced using the determined set of coefficients is used for generating a control signal that causes a production of an anti-noise signal for canceling the primary signal. For example, to cancel an acoustic primary noise, the control signal can be used to generate an acoustic anti-noise signal. The phase and magnitude of the anti-noise signal can be configured to be such that the anti-noise signal cancels or reduces the effect of the primary noise. In some implementations, the set of coefficients for the adaptive filter can be determined also based on a signal that includes the primary noise, and an error signal detected within the ANC system. The error signal may represent a residual noise after at least a partial cancellation of the primary noise by the anti-noise signal.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media or storage device, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A computer-implemented method comprising:
obtaining, at one or more processing devices, a plurality of values representing corresponding sets of coefficients of an adaptive filter over a period of time;
generating an updated set of coefficients for the adaptive filter such that a phase error associated with a transfer function of the adaptive filter is reduced; and
generating a control signal by processing an input signal using the updated set of coefficients of the adaptive filter.

2. The method of claim 1, wherein the phase error is identified based on a trajectory of the coefficients, the trajectory representing variations of the coefficients over the period of time.

3. The method of claim 2 further comprising identifying a sign of the phase error based on a directional skew of the trajectory.

4. The method of claim 1, wherein the phase error is identified based on frequency domain representation of the sets of coefficients.

5. The method of claim 1, wherein the adaptive filter is disposed in an active noise control system.

6. The method of claim 5, wherein the control signal causes production of an anti-noise signal for cancelling a noise in the input signal.

7. The method of claim 6, wherein the updated set of coefficients for the adaptive filter is generated based, at least in part, on an error signal resulting from at least a partial cancellation of a noise in the input signal by an anti-noise signal generated based on the control signal.

8. The method of claim 7, wherein generating the updated set of coefficients comprises:
accessing a model that represents a path between a secondary source that produces the anti-noise signal and a sensor for detecting the error signal;
updating at least one parameter associated with the model; and
adjusting a phase associated with the transfer function of the adaptive filter based on the updated model.

9. The method of claim 1, wherein generating the updated set of coefficients comprises:
adjusting, based on the phase error, a phase associated with the transfer function of the adaptive filter such that coefficients calculated using the phase-adjusted transfer function reduce the phase error; and determining the updated set of coefficients based on the phase-adjusted transfer function.

10. The method of claim 1, comprising adjusting a phase of the transfer function by a predetermined amount to reduce the phase error.

11. The method of claim 10, wherein the predetermined amount is selected in accordance with a stability criterion of the adaptive filter.

12. A system comprising:
   an active noise control engine including one or more processors configured to:
      obtain a plurality of values representing corresponding sets of coefficients of an adaptive filter over a period of time,
      generate an updated set of coefficients for the adaptive filter such that a phase error associated with a transfer function of the adaptive filter is reduced, and
      generate a control signal by processing an input signal using the updated set of coefficients of the adaptive filter.

13. The system of claim 12, wherein the phase error is identified based on a trajectory of the coefficients, the trajectory representing variations of the coefficients over the period of time.

14. The system of claim 13, further comprising identifying a sign of the phase error based on a directional skew of the trajectory.

15. The system of claim 12, wherein the phase error is identified based on frequency domain representation of the sets of coefficients.

16. The system of claim 12, wherein the control signal causes production of an anti-noise signal for cancelling a noise in the input signal.

17. The system of claim 16, wherein the updated set of coefficients for the adaptive filter is generated based, at least in part, on an error signal resulting from at least a partial cancellation of a noise in the input signal by an anti-noise signal generated based on the control signal.

18. The system of claim 17, wherein generating the updated set of coefficients comprises:
   accessing a model that represents a path between a secondary source that produces the anti-noise signal and a sensor for detecting the error signal;
   updating at least one parameter associated with the model; and
   adjusting a phase associated with the transfer function of the adaptive filter based on the updated model.

19. The system of claim 12, wherein generating the updated set of coefficients comprises:
   adjusting, based on the phase error, a phase associated with the transfer function of the adaptive filter such that coefficients calculated using the phase-adjusted transfer function reduce the phase error; and
   determining the updated set of coefficients based on the phase-adjusted transfer function.

20. One or more machine-readable storage devices having encoded thereon computer readable instructions for causing one or more processing devices to perform operations comprising:
   obtaining a plurality of values representing corresponding sets of coefficients of an adaptive filter over a period of time;
   generating an updated set of coefficients for the adaptive filter such that a phase error associated with a transfer function of the adaptive filter is reduced; and
   generating a control signal by processing an input signal using the updated set of coefficients of the adaptive filter.

* * * * *